(12) United States Patent
Gao et al.

(10) Patent No.: US 10,780,561 B2
(45) Date of Patent: Sep. 22, 2020

(54) DETACHING TOOL

(71) Applicants: BOE Technology Group Co., Ltd., Beijing (CN); Beijing BOE Display Technology Co., Ltd., Beijing (CN)

(72) Inventors: Hailong Gao, Beijing (CN); Lizhao Hou, Beijing (CN); Ji Zhang, Beijing (CN); Wei Zhang, Beijing (CN); Yanhong Liu, Beijing (CN); Lei Lv, Beijing (CN); Dandan Xin, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 146 days.

(21) Appl. No.: 15/534,531

(22) PCT Filed: Jun. 17, 2016

(86) PCT No.: PCT/CN2016/086132
§ 371 (c)(1),
(2) Date: Jun. 9, 2017

(87) PCT Pub. No.: WO2017/148046
PCT Pub. Date: Sep. 8, 2017

(65) Prior Publication Data
US 2018/0050444 A1    Feb. 22, 2018

(30) Foreign Application Priority Data

Mar. 2, 2016    (CN) .................... 2016 2 0159789 U (51) Int. Cl.
*B25B 27/14*        (2006.01)
*G02F 1/13*         (2006.01)
(Continued)

(52) U.S. Cl.
CPC .............. *B25B 27/14* (2013.01); *B25C 11/00* (2013.01); *G02F 1/13* (2013.01); *G02F 1/1303* (2013.01); *H05K 7/1402* (2013.01)

(58) Field of Classification Search
CPC . G02F 1/13; B25C 11/00; B25B 27/14; B25B 27/00; B25B 27/04; H05K 13/0007; B25D 3/00
(Continued)

(56) References Cited

U.S. PATENT DOCUMENTS 522,588 A * 7/1894 Chouteau ................. B25D 3/00
                                            407/11
838,987 A * 12/1906 Hanking ................. B25C 11/00
                                            254/25

(Continued)

FOREIGN PATENT DOCUMENTS

CN       203197984 U      9/2013
CN       204544633 U      8/2015
(Continued)

OTHER PUBLICATIONS

International Search Report and Written Opinion for International Application No. PCT/CN2016/086132, dated Dec. 14, 2016, 10 pages.
(Continued)

*Primary Examiner* — Orlando E Aviles
*Assistant Examiner* — Seahee Hong
(74) *Attorney, Agent, or Firm* — Westman, Champlin & Koehler, P.A.

(57) ABSTRACT

Embodiments of the present invention provide a detaching tool The detaching tool includes a detaching plate. A detaching part of the detaching plate is adapted to be inserted between a printed circuit board and a backlight source back plate. The detaching tool is configured to separate and
(Continued)

detach the PCBA, adhered to the backlight source back plate, from the backlight source back plate.

11 Claims, 7 Drawing Sheets

(51) Int. Cl.
*H05K 7/14* (2006.01)
*B25C 11/00* (2006.01)

(58) Field of Classification Search
USPC .............................................. 254/25; 29/270
See application file for complete search history.

(56) References Cited

U.S. PATENT DOCUMENTS

| | | | | |
|---|---|---|---|---|
| 960,193 A * | 5/1910 | Patterson | ................ | B25B 15/00 7/165 |
| 1,350,241 A * | 8/1920 | Routh | ................... | B25D 3/00 30/168 |
| 2,375,942 A * | 5/1945 | Palmer | ................... | B25C 11/00 254/28 |
| 2,400,988 A * | 5/1946 | Goessel | ................ | B25C 11/00 254/28 |
| 4,042,210 A * | 8/1977 | Feldmann | ............... | B25C 11/00 254/26 R |
| 4,144,868 A * | 3/1979 | Heitbrink | ............... | B25D 17/02 125/41 |
| 4,553,737 A * | 11/1985 | Yi | ............................ | B25C 11/00 254/28 |
| 4,622,868 A * | 11/1986 | Flannigan | ............. | E05B 85/085 294/24 |
| D334,518 S * | 4/1993 | Hughes | ............................ | D8/40 |
| 7,673,848 B1 * | 3/2010 | Provines | ................. | B25C 11/00 254/131 |
| 7,735,806 B2 * | 6/2010 | Prater | ..................... | B25B 27/00 254/25 |
| 9,333,635 B2 * | 5/2016 | Quinn | ..................... | C22C 38/04 |
| 2015/0121682 A1 * | 5/2015 | Brown | .................... | B25B 27/14 29/527.2 |
| 2015/0313078 A1 * | 11/2015 | Fay, II | ................. | A01D 34/736 7/164 |
| 2017/0107089 A1 * | 4/2017 | Lenart | ..................... | B25B 33/00 |

FOREIGN PATENT DOCUMENTS

| | | |
|---|---|---|
| CN | 204807858 U | 11/2015 |
| CN | 204893131 U | 12/2015 |
| CN | 105459022 A | 4/2016 |
| JP | 2011-152506 A | 8/2011 |
| JP | 2012-137607 A | 7/2012 |

OTHER PUBLICATIONS

English translation of International Search Report and Written Opinion for International Application No. PCT/CN2016/086132, 21 pages.

* cited by examiner

DETACHING TOOL

CROSS-REFERENCE TO RELATED APPLICATION

This application is a Section 371 National Stage Application of International Application No. PCT/CN2016/086132, filed on 17 Jun. 2016, entitled "DETACHING TOOL", which has not yet published, which claims priority to Chinese Application No. 201620159789.X, filed on 2 Mar. 2016, incorporated herein by reference in their entirety.

BACKGROUND

1. Technical Field

Embodiments of the present invention relates to the field of display technology, and particularly to a detaching tool.

2. Description of the Related Art

Figure 1A:
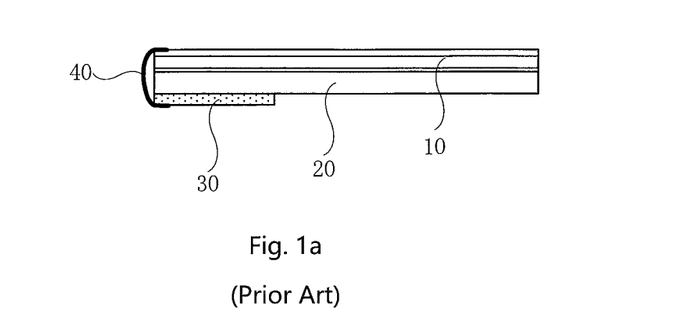
FIG. 1a is a schematic structural side view of a liquid crystal display apparatus.

An LCD (Liquid Crystal Display) has a structure as shown in FIG. 1a. The LCD comprises a display panel 10, a backlight source back plate 20 on a non-display side of the display panel 10, and a PCBA (Printed Circuit Board Assembly) 30 configured to provide a control signal. In order that a screen frame of the LCD can be reduced, generally a PCBA 30 is adhered on a side of the backlight source back plate 20 facing away from the display panel 10 through a double-side adhesive tape 31 as shown in FIG. 1b, and then the PCBA 30 is electrically connected to the display panel 10 through an FPC (Flexible Circuit Board) 40 by pin bonding.

However, when poor quality occurs in the display panel 10 or the PCBA 30 during manufacturing, or when poor connection occurs during the pin bonding, it is necessary to detach the PCBA 30 adhered to the backlight source back plate 20, so as to detect and repair components.

Figure 1B:
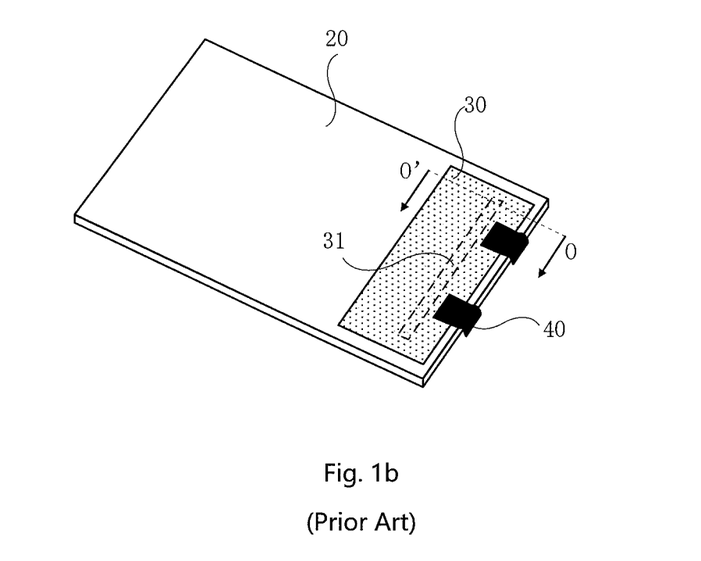

In prior art, an operator usually inserts a bamboo pick between the backlight source back plate 20 and the PCBA 30 and gradually separates the PCBA 30 from the backlight source back plate 20 along a pushing direction indicated by O or O' shown in FIG. 1b. However, the bamboo pick is thick and has a narrow surface. Therefore, during detaching, the bamboo pick tends to be uneasily inserted between the PCBA 30 and the backlight source back plate 20 and tends to cause a non-uniform force received by the PCBA 30 and thus deform the PCBA 30, thereby increasing a defective rate of products.

SUMMARY

Embodiments of the present invention provide a detaching tool comprising a detaching plate. The detaching plate has a wedge-shaped detaching part at one end thereof. The detaching part is adapted to be inserted between a backlight source back plate and a printed circuit board adhered to the backlight source back plate.

In an embodiment, the detaching tool further comprises a stop plate disposed in a position of the detaching plate facing away from a leading edge of the detaching part, wherein a distance from the stop plate to the leading edge of the detaching part is less than a width of the printed circuit board in a first direction, and wherein the first direction is a direction from the stop plate to the leading edge of the detaching part.

In an embodiment, a first groove is formed on an upper surface of the detaching plate, the first groove is configured to introduce a solution into a gap between the backlight source back plate and the printed circuit board, and the solution is used to solve an adhesive between the backlight source back plate and the printed circuit board.

In an embodiment, the detaching tool further comprises a handle disposed at an end of the detaching plate facing away from the leading edge of the detaching part and connected to the detaching plate.

In an embodiment, when the first groove is formed on the upper surface of the detaching plate, the handle is provided with a flow guiding structure which is in communication with the first groove.

In an embodiment, the flow guiding structure is a second groove formed on an upper surface of the handle.

In an embodiment, the second groove has a greater opening area than the first groove.

In an embodiment, the flow guiding structure is a flow guiding tube disposed in the handle.

In an embodiment, when the detaching tool comprises a stop plate, the stop plate is formed with a through hole, and the first groove is in communication with the flow guiding structure through the through hole.

In an embodiment, the handle has a plate shape.

In an embodiment, the handle and the detaching plate are disposed in an integrated structure.

In an embodiment, the handle and the detaching plate are made of a resin material.

In an embodiment, the wedge-shaped detaching part has an angle of inclination which is in the range from 2° to 3°.

In an embodiment, the stop plate is fixed to the position of the detaching plate facing away from the leading edge of the detaching part through a position limit structure, and the position limit structure is configured to adjust the distance from the stop plate to the leading edge of the detaching part.

In an embodiment, the position limit structure comprises a first saw tooth structure disposed along the first direction and having a plurality of saw teeth, and a second saw tooth structure having at least one saw tooth, the saw tooth of the second saw tooth structure is fitted with some of the saw teeth of the first saw teeth structure to fix the stop plate to different positions on the detaching plate, and the first saw tooth structure is located at one of the detaching plate and the stop plate while the second saw tooth structure is located at the other of the detaching plate and the stop plate.

In an embodiment, a guide way is disposed along the first direction at the detaching plate, a slider adapted to slide along the guide way in the first direction is disposed at the stop plate, the stop plate is mounted to the guide way through the slider, the slider and the guide way are provided with the position limit structure, the position limit structure comprises a third groove disposed on a sidewall of the guide way, and an elastic pillar disposed on a sidewall of the slider, and the elastic pillar is located in the third groove when the stop plate is in a limited state.

BRIEF DESCRIPTION OF THE DRAWINGS

In order to describe embodiments of the present invention or technical solutions in the prior art more clearly, accompanying drawings required for describing the embodiments or the prior art will be simply explained as below. Apparently, the accompanying drawings for the following description are only some embodiments of the present invention. Those skilled in the art also could derive other accompanying drawings from these accompanying drawings without making a creative work.

FIG. 1b is a schematic structural perspective view of the liquid crystal display apparatus shown in FIG. 1a;

FIG. 2b is a schematic view showing a detaching process with the detaching tool shown in FIG. 2a;

FIG. 3b is a schematic view showing a detaching process with the detaching tool shown in FIG. 3a;

DETAILED DESCRIPTION OF THE EMBODIMENTS

A clear and complete description of the technical solutions in the embodiments of the present invention will be made as below with reference to embodiments of the present invention taken in conjunction with the accompanying drawings. Apparently, the described embodiments are some of the embodiments of the present invention rather than all of the embodiments of the present invention. All other embodiments derived by those skilled in the art based on the embodiments of the present invention without making a creative work shall fall within the protection scope of the present invention.

Figure 2A:
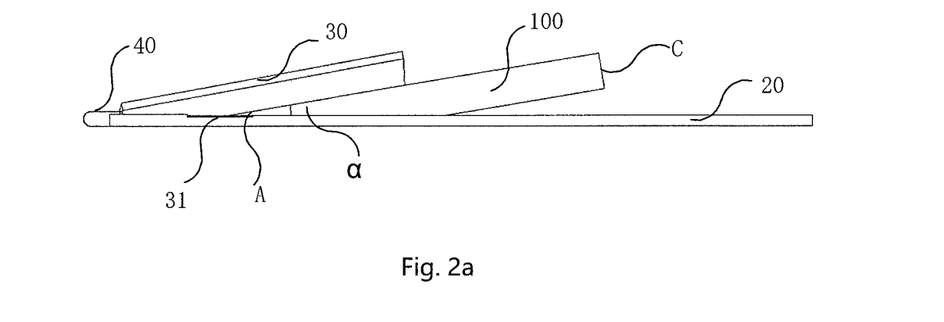
FIG. 2a is a schematic side view showing a structure of a detaching tool according to an embodiment of the present invention and a detaching process with the detaching tool.

Embodiments of the present invention provide a detaching tool. As shown in FIG. 2a, the detaching tool comprises a detaching plate 100. The detaching plate 100 has a wedge-shaped detaching part A adapted to be inserted between a PCBA 30 and a backlight source back plate 20 adhered to each other.

It is to be noted that the detaching plate 100 may be a detaching plate 100 having a wedge-shaped end, or a detaching plate 100 assuming a wedge shape as a whole, as long as the detaching plate has a wedge shape adapted to be inserted between the PCBA and the backlight source back plate.

Specifically, as shown in FIG. 2a, generally the PCBA 30 and the backlight source back plate 20 are adhered to each other by a double-side adhesive tape 31. During detaching, the detaching part A of the detaching plate 100 is inserted into a gap between the PCBA 30 and the backlight source back plate 20. Since the detaching part A of the detaching plate 100 has an angle of inclination α (i.e. an angle between a surface of the detaching part A which comes into contact with the backlight source back plate 20 and a surface of the detaching part A which comes into contact with the PCBA 30), the leading edge of the detaching part A of the detaching plate 100 is thinner than the other end C of the detaching plate facing away from the leading edge of the detaching part. As a result, the detaching part A is very easily inserted into a gap between the PCBA 30 and the backlight source back plate 20. Furthermore, since the detaching part A of the detaching plate 100 has an angle of inclination α, the PCBA 30 tends to be tilted towards a direction away from the backlight source back plate 20 under the action of tension of the angle of inclination α, so that the detaching plate 100 very easily separates the PCBA 30 from the backlight source back plate 20 under the action of the angle of inclination α after it is inserted between the backlight source back plate 20 and the PCBA 30.

Figure 2B:
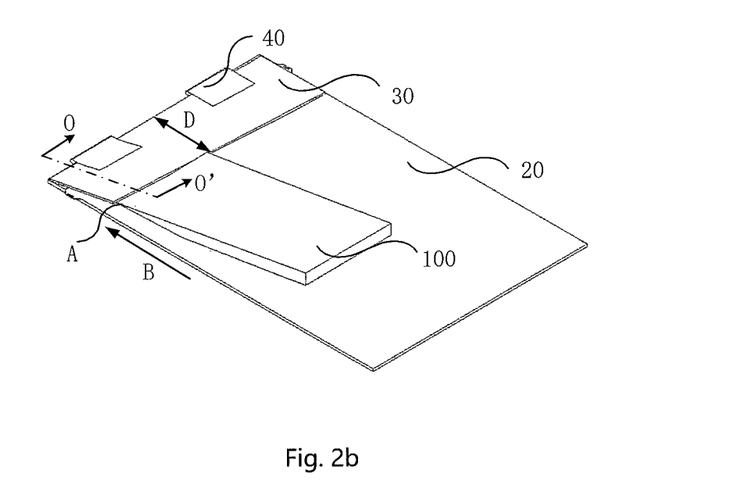

In this case, after the detaching plate 100 is inserted into the gap between the PCBA 30 and the backlight source back plate 20, the detaching plate 100 is pushed in a direction indicated by O or O' as shown in FIG. 2b, so that the PCBA 30 is completely separated from the backlight source back plate 20, thereby completing the detachment of the PCBA 30 from the backlight source back plate 20.

In an embodiment, the angle of inclination α as shown in FIG. 2a may be in the range from 2° to 3°. Specifically, on one hand, when the angle of inclination α is less than 2°, technological requirements for manufacturing the detaching plate 100 is relatively high and the detaching part A of the detaching plate 100 is too thin so that its strength is decreased. The detaching plate is easily broken during detaching, adversely affecting a detaching operation. On the other hand, when the angle of inclination α is greater than 3°, a thickness of the detaching part A of the detaching plate 100 is excessively great, so that the detaching part will not be easily inserted into the gap between the PCBA 30 and the backlight source back plate 20 while it will cause a relatively great deformation of the PCBA, thereby increasing the probability of damaging the PCBA 30. Therefore, in the embodiment of the present invention, the angle of inclination α of the detaching part A of the detaching plate 100 is set within the range from 2° to 3°. In this way, it can be ensured that the detaching part A of the detaching plate 100 has a certain strength while the detaching part can be very easily inserted into the gap between the PCBA 30 and the backlight source back plate 20. The detaching part can be conveniently inserted into the gap between the PCBA 30 and the backlight source back plate 20 quickly, and the probability of damaging the PCBA 30 is decreased.

In an embodiment, an upper surface of the detaching plate 100 is flat. As shown in FIG. 2b, when the PCBA 30 is located above the backlight source back plate 20, the upper surface of the detaching plate 100 is a surface on a side of the detaching plate 100 facing away from the backlight source back plate 20. For example, a surface of the detaching plate 100 which comes into contact with the PCBA 30 during detaching is flat.

The embodiments of the present invention provide a detaching tool comprising a detaching plate. A detaching part of the detaching plate is adapted to be inserted between a printed circuit board and a backlight source back plate. The detaching part has an angle of inclination. Hence, a leading edge of the detaching part of the detaching plate is thinner than the other end of the detaching plate facing away from the leading edge of the detaching part. As a result, when detaching the PCBA on the backlight source back plate, the thinner detaching part of the detaching plate is very easily inserted between the backlight source back plate and the PCBA. In addition, since the detaching part has an angle of inclination, the detaching plate can very easily separate the PCBA from the backlight source back plate under the action of the angle of inclination after the detaching part is inserted between the backlight source back plate and the PCBA. Furthermore, compared with the bamboo pick which is thicker and has a narrower surface in the prior art, the detaching plate assumes a plate-shaped structure and thus can increase an area of contact with the PCBA, so that a force received by the PCBA is relatively uniform, thereby decreasing the probability of damaging the PCBA during detaching.

The PCBA 30 and the backlight source back plate 20 are adhered to each other by the double-side adhesive tape 31 as shown in FIG. 2a. Therefore, during detachment of the PCBA 30 from the backlight source back plate 20, the detaching plate 100 cannot completely clear away the double-side adhesive tape 31 if an applied force is too small when the detaching plate 100 is inserted into the gap between the PCBA 30 and the backlight source back plate 20. In addition, if the applied force is too big, the detaching plate 100 can completely clear away the double-side adhesive tape 31. However, the detaching plate 100 will probably come into direct contact with a flexible circuit board 40 to damage the flexible circuit board 40.

Figure 3A:
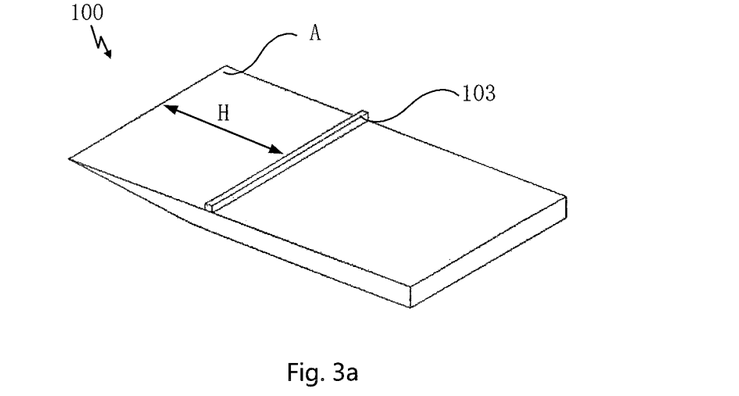
FIG. 3a is a structural schematic view of another detaching tool according to an embodiment of the present invention.
Figure 3B:
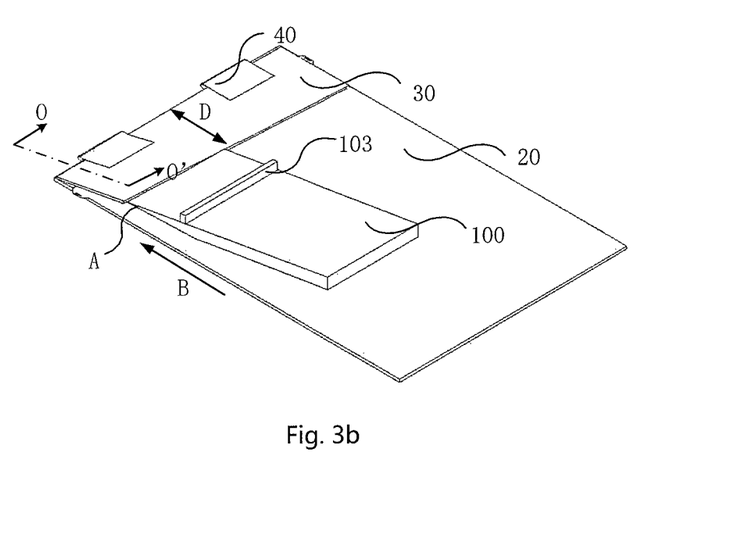

In order to solve the abovementioned problem, as shown in FIG. 3a, the detaching tool further comprises a stop plate 103. The stop plate 103 is disposed in a position of the detaching plate 100 facing away from the leading edge of the detaching part A, and a distance H from the stop plate 103 to the leading edge of the detaching part A is less than a width D of the PCBA 30 in a first direction B as shown in FIG. 3b. The first direction B is a direction from the stop plate 103 to the leading edge of the detaching part A and is also a direction of insertion of the detaching plate 100 into the gap between the PCBA 30 and the backlight source back plate 20.

In this way, the distance H from the stop plate 103 to the leading edge of the detaching part A is less than the width D of the PCBA 30 in the first direction B, as shown in FIG. 3b. Therefore, when the detaching plate 100 is inserted into the gap between the PCBA 30 and the backlight source back plate 20 in the first direction B, further excessive insertion of the detaching plate 100 in the first direction B can be prevented by being stopped by the stop plate 103 even if the applied force is too big during detaching, so as to avoid the detaching plate 100 from damaging the flexible circuit board 40 located at a front end of the PCBA 30.

It is to be noted herein that a PCBA 30 of a different size has a different width D in the first direction B. During detachment of the PCBA 30 with the different width D from the backlight source back plate 20, it is necessary to set the distance H from the stop plate 103 to the leading edge of the detaching part A according to the different width D of the PCBA 30 in the first direction B as long as it can be ensured that the distance H from the stop plate 103 to the leading edge of the detaching part A is less than the width D of the PCBA 30 in the first direction B.

Furthermore, in order to reduce an adhesive force of the double-side adhesive tape 31 between the PCBA 30 and the backlight source back plate 20 so that the PCBA 30 is more easily separated from the backlight source back plate 20 during detaching, generally a solution for solving an adhesive is dropped into the double-side adhesive tape 31 between the PCBA 30 and the backlight source back plate 20, so as to reduce adhesive force of the double-side adhesive tape 31. However, the gap between the PCBA 30 and the backlight source back plate 20 is relatively small. In order to facilitate a dropping operation, it is necessary to lift up the PCBA 30 towards a direction away from the backlight source back plate 20. In this way, the probability of deforming the PCBA 30 and the probability of damaging the PCBA 30 are increased.

Figure 4:
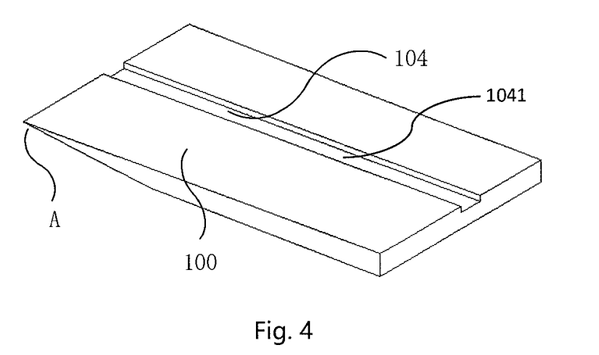
FIG. 4 is a structural schematic view of a detaching tool comprising a first groove according to an embodiment of the present invention.
Figure 5:
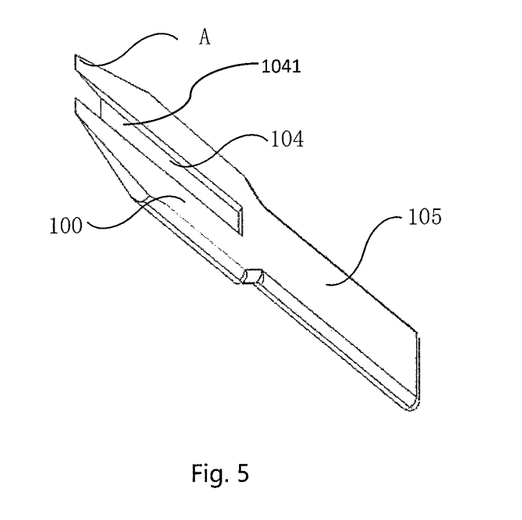
FIG. 5 is a structural schematic view of a detaching tool comprising a handle according to an embodiment of the present invention.

In order to solve the abovementioned technical problem, a first groove 104 configured to introduce a solution for dissolving an adhesive, as shown in FIG. 4, is formed on an upper surface of the detaching plate 100. The first groove 104 has a bottom 1041, as shown in FIG. 4 and FIG. 5. As shown in FIG. 3b, when the PCBA 30 is located above the backlight source back plate 20, the upper surface of the detaching plate 100 is a surface on a side of the detaching plate 100 facing away from the backlight source back plate 20.

A detaching process using the detaching tool provided with the first groove 104 is specifically as follows. Firstly, the detaching plate 100 is inserted into the gap between the PCBA 30 and the backlight source back plate 20. Then, the solution for solving the adhesive is dropped into the first groove 104. The dropped solution will be introduced into the gap between the PCBA 30 and the backlight source back plate 20 along the first groove 104 to come into contact with the adhesive in the gap. Since the solution has certain solvent action on the adhesive, it reduces adhesive force of the adhesive, thereby facilitating separation and detachment of the PCBA 30 from the backlight source back plate 20. In this way, the solution for solving the adhesive is directly introduced into the adhesive between the PCBA 30 and the backlight source back plate 20 through the first groove 104, avoiding a need to lift up the PCBA 30 towards the direction away from the backlight source back plate 20 in order to facilitate dropping of the solution, and thus reducing the probability of deforming the PCBA 30 and the probability of damaging the PCBA 30.

It is to be noted herein that in the embodiment of the present invention the solution for solving the adhesive is not limited in any way as long as the solution can have certain solvent action on the adhesive in the gap between the PCBA 30 and the backlight source back plate 20. Common solutions for solving the adhesive are organic solvents such as alcohols, esters, and ketones, for example, ethanol (e.g., spirit made of ethanol), acetone, etc. In addition, in the embodiment of the present invention, a specific shape of the first groove 104 is not limited as long as it can be ensured that the solution for solving the adhesive can be introduced into the gap between the PCBA 30 and the backlight source back plate 20 along the first groove 104 to come into contact with the adhesive in the gap.

In addition, in order to facilitate controlling of the detaching plate 100 by a human hand and to be in better control of a size of the force applied to the detaching plate 100 during separation of the PCBA 30 from the backlight source back plate 20 by the detaching plate 100, the detaching tool further comprises a handle 105 disposed at an end of the detaching plate 100 facing away from the leading edge of the detaching part A and connected to the detaching plate 100, as shown in FIG. 5. The handle 105 extends in the first direction B.

Furthermore, if a surface of the first groove 104 is completely covered by the PCBA 30 during insertion of the detaching plate 100 into the gap between the PCBA 30 and the backlight source back plate 20, when it is necessary to supply the solution for solving the adhesive, it is necessary to pull out the detaching plate 100, drop the solution into the first groove 104, and then insert the detaching plate 100 into the gap between the PCBA 30 and the backlight source back plate 20 again. In this way, the detaching process is caused to be complicated.

In order to solve the abovementioned problem, when the detaching tool has the handle 105, the handle 105 may be provided with a flow guiding structure which is in communication with the first groove 104.

A specific structure of the flow guiding structure will be described as below.

Figure 6:
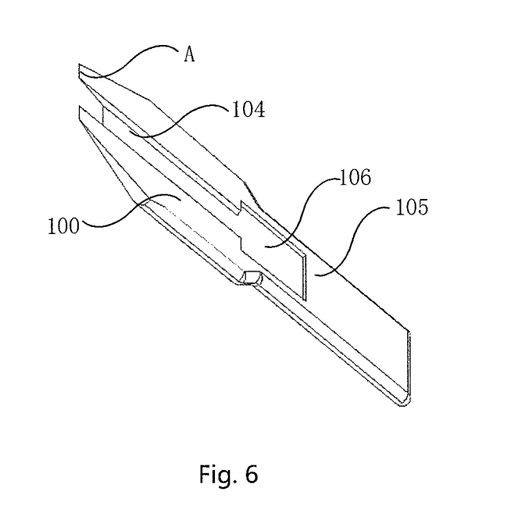
FIG. 6 is a structural schematic view of a detaching tool based on that shown in FIG. 5 and comprising a second groove.

For example, as shown in FIG. 6, the flow guiding structure may be a second groove 106 formed on an upper surface of the handle 105, and the second groove 106 has a greater opening area than the first groove 104.

In this way, when the detaching plate 100 is inserted into the gap between the PCBA 30 and the backlight source back plate 20, the solution for solving the adhesive enters the first groove 104, which is in communication with the second groove 106, along the second groove 106 by dropping the solution into the second groove 106 on the handle 105, and thus it can come into contact with the adhesive in the gap between the PCBA 30 and the backlight source back plate 20, so that the PCBA 30 is easily detached from the backlight source back plate 20.

In an embodiment, the second groove 106 has a greater opening area than the first groove 104, so that the solution can be more easily dropped into the second groove 106, thereby decreasing waste of the solution for solving the adhesive caused by inability to drop the solution into the first groove 104 accurately due to a smaller opening area of the first groove 104.

Further, for example, most of the solutions for solving the adhesive are organic solvents, and most of the organic solvents have certain volatility. Therefore, due to volatilization of the solution in a process from dropping of the solution into the flow guiding structure to final contacting of the solution with the adhesive in the gap, only a part of the solution can come into contact with the adhesive in the gap, so that it is necessary to increase an amount of the dropped solution, and controlling of an amount of the added solution by an operator is adversely affected.

Figure 7A:
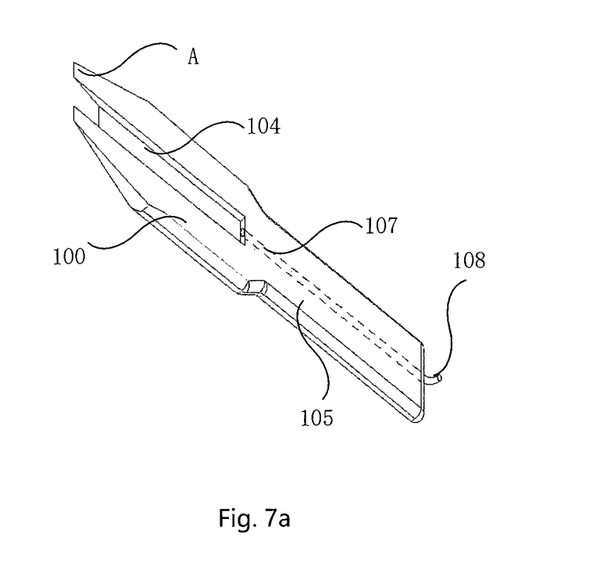
FIG. 7a is a structural schematic view of a detaching tool based on that shown in FIG. 5 and comprising a flow guiding tube.

In order to solve the abovementioned problem, the flow guiding structure may also be a flow guiding tube 107 disposed in the handle, as shown in FIG. 7a. In this way, when the detaching plate 100 is inserted into the gap between the PCBA 30 and the backlight source back plate 20, the solution is dropped into the flow guiding tube 107 in the handle 105 through an end 108 of the flow guiding tube 107. The solution enters the first groove 104, which is in communication with the flow guiding tube 107, along the flow guiding tube 107, and thus can come into contact with the adhesive in the gap between the PCBA 30 and the backlight source back plate 20, thereby reducing a time of direct exposure of the solution to air and an amount of volatilization of the solution while also facilitating controlling of an amount of the added solution by an operator.

Figure 7B:
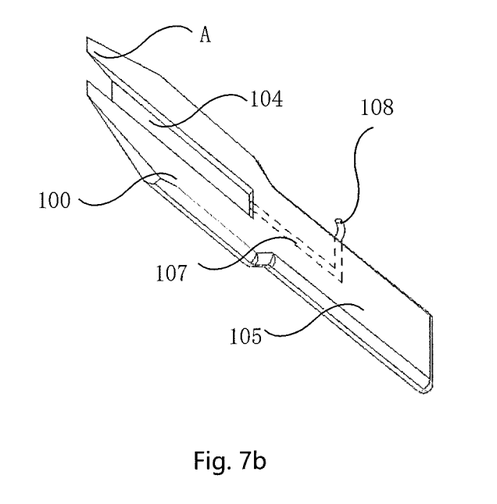
FIG. 7b is a structural schematic view of another detaching tool based on that shown in FIG. 5 and comprising a flow guiding tube.

It is to be noted herein that in the embodiment of the present invention, a specific shape of the flow guiding tube 107 is not limited as long as it can be ensured that the solution can flow into the first groove 104 in detaching operation. For example, the flow guiding tube 107 may have a circular, rectangular or elliptical cross-sectional shape. In addition, the flow guiding tube 107 may be a straight line-shaped flow guiding tube. Specifically, as shown in FIG. 7a, the flow guiding tube 107 is disposed in the handle 105 along the first direction B, and the end 108 of the flow guiding tube 107 is disposed at an end of the handle 105. Alternatively, the flow guiding tube 107 may be a bent flow guiding tube. Specifically, as shown in FIG. 7b, the end 108 of the flow guiding tube 107 is disposed on a side of the handle 105, and the flow guiding tube 107 is disposed in a bent shape in the handle 105.

Figure 8A:
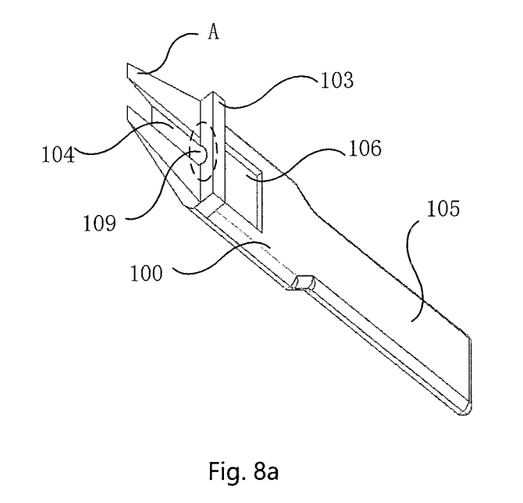
FIG. 8a is a structural schematic view of a detaching tool according to an embodiment of the present invention comprising a through hole.

In an embodiment, as shown in FIG. 8a, when the detaching tool comprises the stop plate 103, the stop plate 103 is formed with a through hole 109, and the first groove 104 is in communication with the flow guiding structure through the through hole 109.

It is to be noted herein that in the embodiment of the present invention, a shape of the through hole 109 is not specifically limited, and the through hole 109 may have a circular, elliptical or rectangular opening shape; while in the embodiment of the present invention the number of the through hole 109 is not specifically limited, and the through hole may be one or more through holes as long as it can be ensured that the solution dropped into the flow guiding structure can enter the first groove 104 through the through hole 109.

Figure 8B:
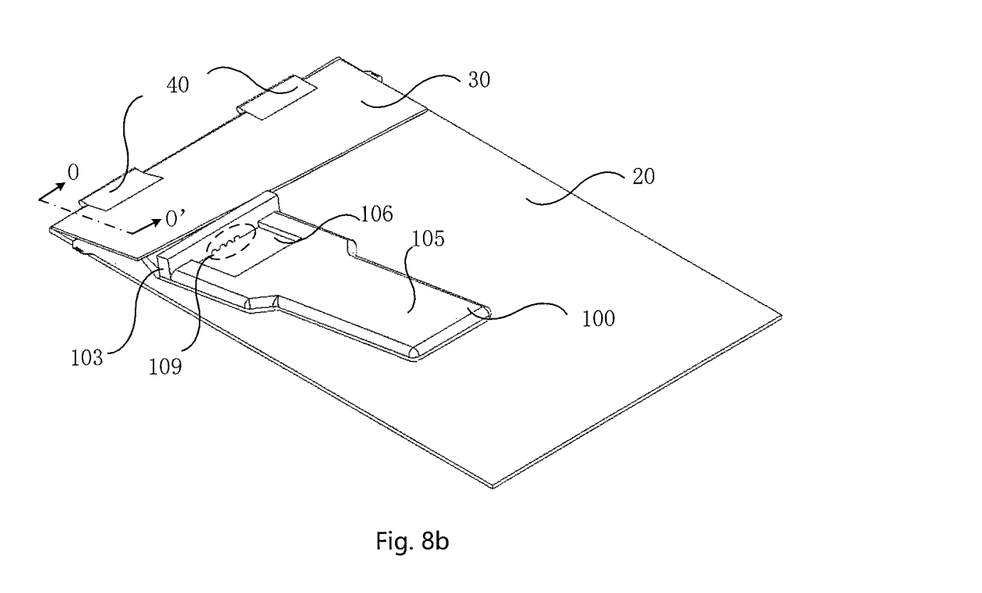
FIG. 8b is a schematic view showing a detaching process with another detaching tool according to an embodiment of the present invention comprising through holes.

A specific detaching process using the detaching tool as shown in FIG. 8b will be described in detail as below. The detaching tool comprises a detaching plate 100, a first groove 104 and a second groove 106 which are located on an upper surface of the detaching plate 100, a stop plate 103, a handle 105, and a plurality of through holes 109 located in the stop plate 103 and communicating the first groove 104 with the second groove 106. When a detaching operation is performed, the detaching part A of the detaching plate 100 is inserted into the gap between the PCBA 30 and the backlight source back plate 20 in such a way that the handle 105 is grasped by a hand. Then, the solution is dropped into the second groove 106, and the dropped solution uniformly enters the first groove 104 along the second groove 106 through the plurality of through holes 109 formed in the stop plate 103, so as to come into contact with the adhesive in the gap between the PCBA 30 and the backlight source back plate 20. Next, the detaching tool is pushed in a direction indicated by O or O' by grasping the handle 105 by the hand, thereby completing detachment of the PCBA 30 from the backlight source back plate 20.

In an embodiment, the handle 105 has a plate shape, so as to be similar in structure to the plate-shaped detaching plate 100. The detaching plate 100 and the handle 105 may be manufactured by similar processes, thereby simplifying manufacturing technology. Furthermore, when the plate-shaped handle 105 is adopted, a contact area between the hand and the handle 105 when the handle 105 is grasped by the hand is relatively big. Therefore, during detaching, relative slip between the hand and the handle 105 does not easily occur. As a result, a size of a force applied during detaching can be controlled better.

In an embodiment, the handle 105 and the detaching plate 100 are disposed in an integrated structure. The handle 105 and the detaching plate 100 can be manufactured in one manufacturing step, avoiding a sequent assembling process and thus further simplifying manufacturing process flow.

In an embodiment, materials of the handle 105 and the detaching plate 100 are a resin material. The resin material has certain toughness and has a relatively low hardness, so that damage to the PCBA 30 during detaching operation can be reduced.

In an embodiment, as shown in FIG. 2b and FIG. 3a, the distance H from the stop plate 103 to the leading edge of the detaching part A is less than the width D of the PCBA 30 in the first direction B, thereby effectively preventing the detaching plate 100 from being excessively inserted in the first direction B due to a too big force applied to the detaching plate, and damaging the flexible circuit board 40 located at a front end of the PCBA 30. In this case, since a different PCBA 30 has a different width D in the first direction B, it is necessary to manufacture a different detaching plate 100 so that the distance H from the stop plate 103 to the leading edge of the detaching part A is suitable for the width of the PCBA 30. Therefore, it is necessary to manufacture a detaching tool corresponding to the PCBA 30 of the different width, thereby increasing a manufacturing cost.

In order to solve the abovementioned problem, the stop plate 103 may be fixed to the position of the detaching plate 100 facing away from the leading edge of the detaching part A through a position limit structure, and the position limit structure is configured to adjust the distance H from the stop plate 103 to the leading edge of the detaching part A. Thereby, the distance H from the stop plate 103 to the leading edge of the detaching part A can be directly adjusted by the position limit structure according to the different width D of the different PCBA 30 in the first direction B during specific detachment, so that the distance H from the stop plate 103 to the leading edge of the detaching part A is less than the width D of the PCBA 30 in the first direction B. As a result, it is achieved that a single detaching tool can satisfy detachments of the PCBAs 30 of different widths, thereby saving the manufacturing cost.

The position limit structure will be described in detail as below.

Figure 9A:
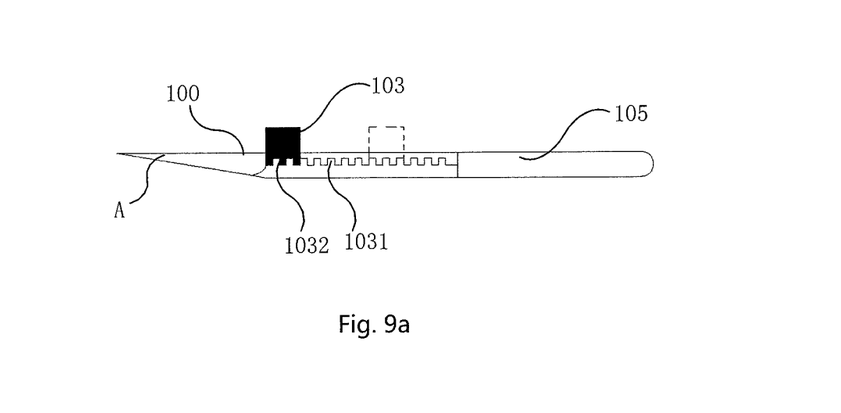
FIG. 9a is a structural schematic view of a detaching tool according to an embodiment of the present invention comprising a position limit structure.

For example, as shown in FIG. 9a, the position limit structure comprises a first saw tooth structure 1031 disposed along the first direction B and having a plurality of saw teeth, and a second saw tooth structure 1032 having at least one saw tooth, the saw tooth of the second saw tooth structure is fitted with some of the saw teeth of the first saw teeth structure 1031, to fix the stop plate to different positions on the detaching plate, and the first saw tooth structure 1031 is located at the detaching plate 100 while the second saw tooth structure 1032 is located at the stop plate 103.

In this way, during detaching, the second saw tooth structure 1032 located at the stop plate 103 can be engaged with the first saw tooth structure 1031 located at the detaching plate 100, based on a size where the distance H from the stop plate 103 to the leading edge of the detaching part A is less than the width D of the PCBA 30 in the first direction B, according to the different width D of the PCBA 30 in the first direction B. As a result, requirement of detachments of the PCBAs 30 with different size is satisfied.

It is to be noted herein that in the embodiment of the present invention, the description is carried out by means of an example shown in FIG. 9 in which the first saw tooth structure 1031 is located at the detaching plate 100 while the second saw tooth structure 1032 is located at the stop plate 103. In addition, the first saw tooth structure 1031 may also be disposed at the stop plate 103 while the second saw tooth structure 1032 may also be disposed at the detaching plate 100. A specific detaching process under this condition is the same as that under a condition where the second saw tooth structure 1032 is disposed at the stop plate 103 while the first saw tooth structure 1031 is disposed at the detaching plate 100, and is no longer described herein in detail.

Figure 9B:
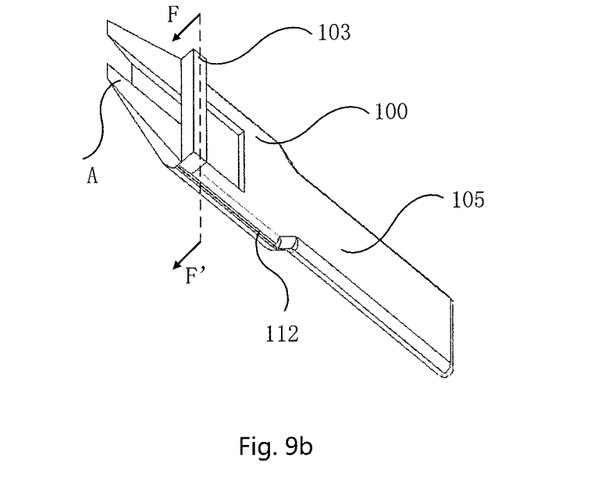
FIG. 9b is a structural schematic view of another detaching tool according to an embodiment of the present invention comprising a position limit structure.
Figure 9C:
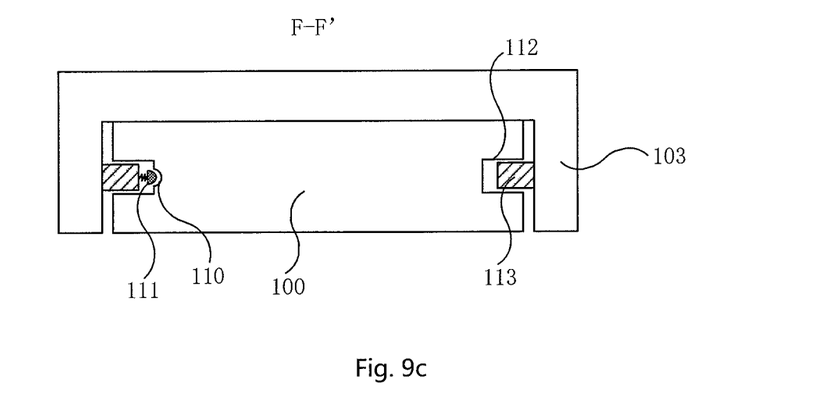
FIG. 9c is a structural schematic section view taken along the line F-F in FIG. 9b.

In addition, for example, as shown in FIG. 9b, a guide way 112 is disposed along the first direction B at the detaching plate 100, a slider 113 is disposed at the stop plate 103 as shown in FIG. 9c (which is a section view taken along the line F-F in FIG. 9b), the stop plate 103 is mounted to the guide way 112 through the slider 113, and the slider 113 and the guide way 112 are provided with the position limit structure. The position limit structure comprises a third groove 110 disposed on a sidewall of the guide way 112, and an elastic pillar 111 disposed on a sidewall of the slider 113, and the elastic pillar 111 is located in the third groove 110 when the stop plate 103 is in a limited state. In the embodiment of the present invention, the number of the guide way 112 is not limited, and the position limit structure may be disposed between each guide way 112 and each slider 113, or as shown in FIG. 9c, the position limit structure is disposed between only one guide way 112 and the slider 113 cooperating with the one guide way 112.

A process of adjusting a position of the stop plate 103 shown in FIG. 9c is specifically described as below. When the stop plate 103 is in the limited state, the elastic pillar 111 is located in the third groove 110. In this case, a relative position between the stop plate 103 and the detaching plate 100 is fixed. When the position of the stop plate 103 needs to be adjusted, the stop plate 103 may be forcibly pushed in a direction along the guide way 112. The stop plate 103 can be moved in the direction along the guide way 112 by being guided by the guide way 112 through the slider 113. And, during moving, the elastic pillar 111 is compressed, and thus slides out from the third groove 110 until the elastic pillar 111 located at the stop plate 103 is pushed to a next third groove 110. The elastic pillar 111 enters the third groove 110 under the action of a restoring force of a spring, thereby completing the adjustment of the position of the stop plate 103. In this way, the distance H from the stop plate 103 to the leading edge of the detaching part A can be directly adjusted by the position limit structure according to the different width D of the different PCBA 30 in the first direction B, so that the distance H from the stop plate 103 to the leading edge of the detaching part A is less than the width D of the PCBA 30 in the first direction B.

Embodiments of the present invention provide a detaching tool which is easily inserted between the PCBA and the backlight source back plate and by which a probability of resulting in damage of the PCBA can be decreased, during detaching.

Embodiments of the present invention provide a detaching tool comprising a detaching plate. A detaching part of the detaching plate is adapted to be inserted between a printed circuit board and a backlight source back plate. The detaching part of the detaching plate has an angle of inclination. Hence, a leading edge of the detaching part of the detaching plate is thinner than the other end of the detaching plate facing away from the leading edge of the detaching part. As a result, when detaching the PCBA on the backlight source back plate, the thinner detaching part of the detaching plate is very easily inserted between the backlight source back plate and the PCBA. In addition, since the detaching part of the detaching plate has an angle of inclination, it can very easily separate the PCBA from the backlight source back plate under the action of the angle of inclination after the detaching part of the detaching plate is inserted between the backlight source back plate and the PCBA. Furthermore, compared with the bamboo pick which is thicker and has a narrower surface in the prior art, the detaching plate assumes a plate-shaped structure and thus can increase an area of contact with the PCBA, so that a force received by the PCBA is relatively uniform, thereby decreasing the probability of damaging the PCBA during detaching.

The above contents are only the specific embodiments of the present invention. However, the protection scope of the present invention is not limited to these. Changes or alternatives which can be easily conceived by any person skilled in the art within the technical scope disclosed in the present invention should be contained within the protection scope of the present invention. Therefore, the protection scope of the present invention should be defined by the protection scope of the claims.

What is claimed is:

1. A detaching tool, comprising:
    a detaching plate, wherein the detaching plate has a first end, a second end opposite to the first end, and a wedge-shaped detaching part at the first end, and the detaching part is adapted to be inserted between a backlight source back plate and a printed circuit board adhered to the backlight source back plate;
    a handle disposed at the second end of the detaching plate facing away from a leading edge of the detaching part and connected to the detaching plate; and
    a stop plate disposed in a position of the detaching plate facing away from the leading edge of the detaching part,
    wherein a first groove is formed on an upper surface of the detaching plate, the first groove is configured to introduce a solution into a gap between the backlight source back plate and the printed circuit board,
    wherein the first groove has a bottom extending from at least a position adjacent to the second end of the detaching plate towards the first end of the detaching plate such that when the detaching part is at least partly inserted between the backlight source back plate and the printed circuit board, the solution flows towards the first end of the detaching plate on the bottom,
    wherein the handle is provided with a flow guiding structure which is in communication with the first groove, and
    wherein the stop plate is formed with a through hole, and the first groove is in communication with the flow guiding structure through the through hole.

2. The detaching tool of claim 1, wherein the flow guiding structure is a second groove formed on an upper surface of the handle.

3. The detaching tool of claim 2, wherein the second groove has a greater opening area than the first groove.

4. The detaching tool of claim 1, wherein the flow guiding structure is a flow guiding tube disposed in the handle.

5. The detaching tool of claim 1, wherein at least one of the handle and the detaching plate is made of a resin material.

6. The detaching tool of claim 1, wherein the wedge-shaped detaching part has an angle of inclination which is in the range from 2° to 3°.

7. The detaching tool of claim 1, wherein the stop plate is fixed to the position of the detaching plate facing away from the leading edge of the detaching part through a position limit structure, and the position limit structure is configured to adjust the distance from the stop plate to the leading edge of the detaching part.

8. The detaching tool of claim 7, wherein the position limit structure comprises a first saw tooth structure disposed along a direction from the stop plate to the leading edge of the detaching part and having a plurality of saw teeth, and a second saw tooth structure having at least one saw tooth, the saw tooth of the second saw tooth structure is fitted with some of the saw teeth of the first saw teeth structure to fix the stop plate to different positions on the detaching plate, and
    the first saw tooth structure is located at one of the detaching plate and the stop plate while the second saw tooth structure is located at the other of the detaching plate and the stop plate.

9. The detaching tool of claim 1, wherein the handle has a plate shape.

10. The detaching tool of claim 1, wherein the handle and the detaching plate are disposed in an integrated structure.

11. A detaching tool, comprising:
    a detaching plate, wherein the detaching plate has a wedge-shaped detaching part at one end thereof, and the detaching part is adapted to be inserted between a backlight source back plate and a printed circuit board adhered to the backlight source back plate; and
    a stop plate disposed on one of two opposite surfaces, in a thickness direction, of the detaching plate and in a position of the detaching plate facing away from a leading edge of the detaching part so as to limit a depth of insertion of the leading edge of the detaching part between the backlight source back plate and the printed circuit board,
    wherein the stop plate is fixed to the position of the detaching plate facing away from the leading edge of the detaching part through a position limit structure, and the position limit structure is configured to adjust the distance from the stop plate to the leading edge of the detaching part,
    wherein a guide way is disposed along a direction from the stop plate to the leading edge of the detaching part at the detaching plate, a slider adapted to slide along the guide way in the direction from the stop plate to the leading edge of the detaching part is disposed at the stop plate, the stop plate is mounted to the guide way through the slider, and the slider and the guide way are provided with the position limit structure; and
    the position limit structure comprises a groove disposed on a sidewall of the guide way, and an elastic pillar disposed on a sidewall of the slider, and the elastic pillar is located in the groove when the stop plate is in a limited state.

\* \* \* \* \*